United States Patent

Kasano et al.

[15] 3,678,302

[45] July 18, 1972

[54] SOLID STATE ELECTRONIC DEVICE UTILIZING DIFFERENCE IN EFFECTIVE MASS

[72] Inventors: Hiroyuki Kasano, Akishima; Masao Kawamura, Kokubunji, both of Japan

[73] Assignee: Hitachi, Ltd., Tokyo, Japan

[22] Filed: March 10, 1971

[21] Appl. No.: 122,916

[30] Foreign Application Priority Data

March 13, 1970 Japan....................................45/20883

[52] U.S. Cl.........................307/299, 317/234 V, 317/235 A, 317/235 H, 317/235 AC, 317/235 AP

[51] Int. Cl.............................................H01l 3/00, H01l 5/00

[58] Field of Search.............317/235 AC, 234 U; 331/107 G; 307/299

[56] References Cited

UNITED STATES PATENTS

| | | | |
|---|---|---|---|
| 3,263,095 | 7/1966 | Fang | 317/235 AC |
| 3,273,030 | 9/1966 | Balk et al. | 317/235 AC |
| 3,467,896 | 9/1969 | Kroemer | 317/234 |
| 3,215,862 | 11/1965 | Erlbach | 317/234 X |
| 3,305,685 | 2/1967 | Wang | 317/235 N |

*Primary Examiner*—John W. Huckert
*Assistant Examiner*—William D. Larkins
*Attorney*—Craig and Antonelli

[57] ABSTRACT

A solid state electronic device comprising an element including two semiconductor crystal regions of different effective mass of carriers forming a junction therebetween, and electrodes for forming two orthogonal electric fields in said element, in which carriers may be totally reflected at the junction by controlling one of the two fields to cause an abrupt change in the current flowing through the element.

15 Claims, 16 Drawing Figures

INVENTORS

HIROYUKI KASANO and MASAO KAWAMURA

BY Craig, Antonelli & Hill

ATTORNEYS

INVENTORS

HIROYUKI KASANO and MASAO KAWAMURA

BY Craig, Antonelli & Hill

ATTORNEYS

INVENTORS

HIROYUKI KASANO and MASAO KAWAMURA

BY Craig, Antonelli & Hill
ATTORNEYS

INVENTORS
HIROYUKI KASANO and MASAO KAWAMURA
BY Craig, Antonelli & Hill
ATTORNEYS

INVENTORS

HIROYUKI KASANO and MASAO KAWAMURA

BY Craig, Antonelli & Hill

ATTORNEYS

SOLID STATE ELECTRONIC DEVICE UTILIZING DIFFERENCE IN EFFECTIVE MASS

BACKGROUND OF THE INVENTION

1. FIELD OF THE INVENTION

This invention relates to a solid state electronic device capable of controlling the current flowing through a semiconductor junction interface formed therein, and more particularly to a device capable of controlling the reflection of carriers at the junction surface based on the difference in the effective mass of the carriers.

1. DESCRIPTION OF THE PRIOR ART

Conventionally, such high frequency elements using semiconductive material have been developed and widely used for oscillation, amplification, switching, etc. as elements having a PN junction as transistors or diodes, bulk elements having a negative bulk conductance as Gunn element, and hetero-junction elements having a metal-semiconductor junction, metal-insulator-semiconductor (MIS) structure, etc.

However, PN junction elements have such a drawback that the upper limit of the usable frequency is limited by the junction capacitance and the lifetime of the minority carriers. In bulk elements, since the configuration of the electric field formed in the bulk dominates the operation of the element, slight imperfecction or inhomogeneity causes a decrease in the yield and/or dispersion of the characteristics. Further, since bulk elements generally show the active characteristics under extremely high electric fields, their outputs are limited by heat generation and also they are of low efficiency.

Further in any of the PN junction, bulk and hetero-junction elements, the current to voltage (IV) characteristic of the element is determined by the kind, properties, shape and dimensions of the element material, therefore an arbitrarily variable operation cannot be expected in a device employing these elements.

SUMMARY OF THE INVENTION

An object of the invention is to provide an electronic device comprising a functional element having variable and flexible active characteristics, which can perform a variety of operations.

Another object of the invention is to provide an electronic device having said features and operating in extremely high frequency region.

Further object of the invention is to provide an electronic device having a simple, strong and easy-to-make element structure and a simple circuit arrangement and said features.

To achieve the above objects, this invention provides a solid state electronic device capable of controlling the carrier reflection at the interface of a pair of semiconductor crystal regions having the different effective mass of carriers comprising:

- an element body having at least a pair of regions joined with each other, each of said regions being made of a semiconductor crystal, said crystal being selected and arranged in such a manner that carriers passing across the interface of said joined regions have the different effective mass from each other in said two regions;
- a first circuit means for forming a current path for the carriers passing said interface;
- a second circuit means for forming a current path for the carriers which are reflected at said interface and drift only in one region having the larger effective mass of carriers;
- means for forming a plurality of electric fields in said element, at least one of said fields having a different direction from the rest, and the field strength of at least one of said fields being variable so that a resultant field of said fields may have the direction effecting the total reflection of carriers due to the difference of said effective masses at said interface, thereby causing an abrupt change of electric current in said current paths.

Other features, principles, advantages of this invention will become apparent from the following detailed description of some embodiments of the invention made in connection with the accompanying drawing.

DESCRIPTION OF THE PREFERRED EMBODIMENTS

As is well known, in a semiconductor crystal body applied with an electric field, carriers in the crystal are acted by the periodic potential field of the crystal as well as by said external electric field. Thus, the carriers show different response to the applied field from that of a free charge. In order to separate the actions of said two fields on the carriers, the concept of "effective mass" of the carriers are introduced and the action of the periodic field of the crystal lattice on the carriers is substituted by this concept. Namely, a carrier in a crystal behaves as a free charge having the effective mass. Therefore, the effective mass of carriers differs according to crystal and further in an anisotropic crystal a carrier has different effective mass according to the direction of motion.

Figure 1:
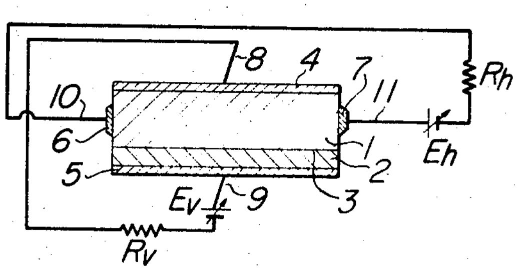
FIG. 1 is a cross-sectional diagram of an embodiment of the basic structure of the invention.
Figure 2:
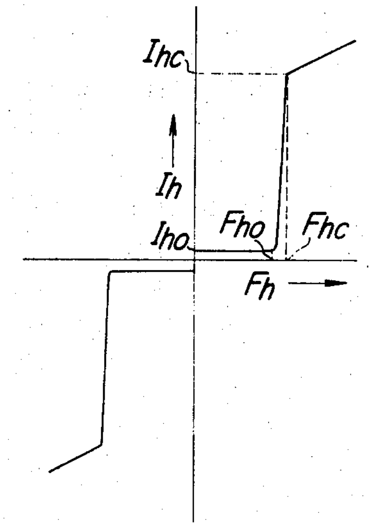
FIGS. 2 and 3 are curves representing the current vs. voltage characteristics along the different current paths.

In the basic structure of the invention, a junction is formed between two semiconductor regions in which carriers have different effective mass and two pairs of electrodes are formed for establishing two electric fields perpendicular and parallel to the junction surface and for deriving currents flowing through and along the junction surface. An electrical network including a variable voltage source is connected to this element. The reflection of the carriers at the junction surface due to the difference in the effective mass can be controlled by the variable voltage to generate a peculiar current vs. voltage characteristic due to the carrier reflection at the junction interface. The present device performs a variety of operations using this peculiar and remarkable characteristics. The principles and operation mechanism of the present invention will be described using the basic structure described above and shown in FIG. 1. In FIG. 1, an *n*type semiconductor crystal region 1 in which the effective mass of a conduction electron is $m_1$ forms a junction at an interface 3 with a semiconductor crystal region 2 in which the effective mass of a conduction electron $m_2$ is smaller than that of said region 1, $m_2 < m_1$. A pair of electrodes 4 and 5 are ohmically connected to the end surfaces of the regions 1 and 2 parallel to said interface 3, respectively. Another pair of electrodes 6 and 7 are ohmically connected to the mutually parallel end surfaces of the region 1 which are orthogonal to the interface 3. Leads 8, 9, 10 and 11 are connected to these electrodes 4, 5, 6 and 7, respectively. A variable d.c. voltage source $E_v$ and a load resistance $R_v$ are connected between the electrodes 4 and 5 through the leads 8 and 9 with such polarity as to form an electric field $F_v$ directed from the electrode 5 to the electrode 4. Further, another variable d.c. voltage source $E_h$ and a load resistance $R_h$ are connected to the electrodes 6 and 7 through the leads 10 and 11 to form an electric field $F_h$ in the crystal region 1 perpendicular to said field $F_v$. In the above network, the voltage $V_v$ applied between the electrodes 4 and 5 by the voltage source $E_v$ is set sufficiently high and field intensity $F_v$ in the element is fixed at a sufficiently high value. When the voltage of the source $E_h$ is increased gradually from 0 V, almost constant and minute current $I_{ho}$ flows through $E_h$ below a certain field intensity $F_{ho}$. When the intensity $F_h$ exceeds this value $F_{ho}$, the current $I_h$ abruptly and rapidly increases up to $I_{hc}$ at the field intensity $F_{hc}$. Above the intensity $F_{hc}$, the current $I_h$ increases almost linearly with the intensity $F_h$. Similar behavior is also observed naturally when the polarity of the voltage source $E_h$ is reversed. FIG. 2 shows the $I_h$ - $F_h$ relation described above which is symmetric. Further, if the intensity $F_v$ is varied and fixed at another value, the $I_h$ - $V_h$ curve is shifted and values, $F_{ho}$, $F_{hc}$, $I_{ho}$, $I_{hc}$ are varied.

Figure 3:
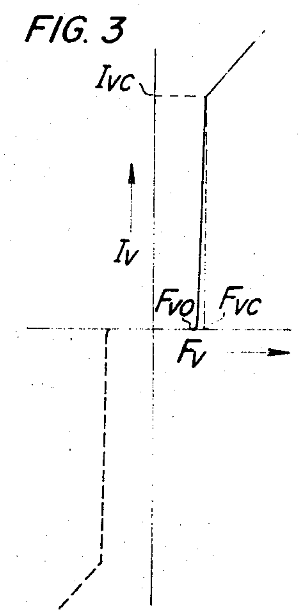

Further, in the above arrangement, setting the voltage $V_h$ applied between the electrodes 6 and 7 by the source $E_h$ so as to form an electric field larger than $F_{hc}$ in the crystal 1, when the voltage $V_v$ between the electrodes 4 and 5 is increased from 0 V to gradually increase the intensity of the field $F_v$ perpendicular to the interface 3, with $F_v$ below $F_{vo}$ the current $I_v$ flowing through $E_v$ is almost zero but above $F_{vo}$ the current $I_v$ rapidly increases to the value of $I_{vc}$ at $F_{vc}$. For $F_v$ above $F_{vc}$, the current $I_v$ changes almost linearly with the field intensity $F_v$. The solid line in FIG. 3 represents the $I_v$ - $F_v$ relationship described above. This peculiar $I_v$ - $F_v$ relationship does not appear when the polarity of the voltage $E_v$ is reversed and a linear $I_v$ - $F_v$ relationship appears.

Further, if the field intensity $F_h$ is varied and fixed at another value, the $I_v$ - $F_v$ characteristic shifts the some extent.

Figure 4:
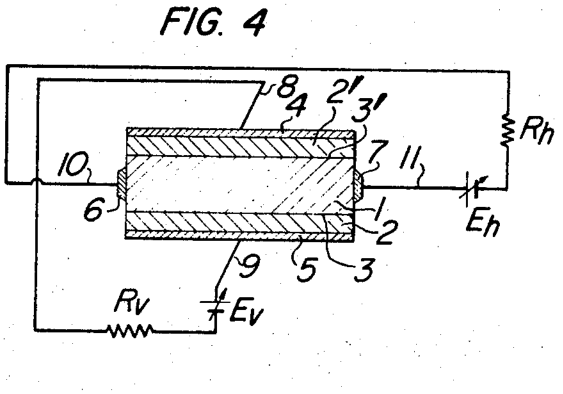
FIG. 4 is a cross-sectional diagram of another embodiment of the basic structure of the invention.

FIG. 4 shows another embodiment of the basic structure of the invention, in which the element structure of FIG. 1 is partially changed so that a crystal region 2' same as the crystal region 2 is inserted between the crystal 1 and the electrode 4 with a junction interface 3' formed between the crystal regions 2' and 1 so as to form a sandwich structure. Similar electric connection to that of FIG. 1 is done to this element. This embodiment shows a similar $I_h$ - $F_h$ characteristic to that of the embodiment of FIG. 1 and further a symmetric $I_v$ - $F_v$ characteristic with respect to the polarity reversal of the voltage $E_v$ as shown in the solid and broken lines of FIG. 3.

Said two kinds of $I_h$ - $F_h$ and $I_v$ - $F_v$ characteristics may be considered to arise from the following mechanism.

In a state when a sufficiently strong electric field $F_v$ is formed perpendicular to the interface in the element, and if a weak electric field $F_h$ is formed perpendicular to said field $F_v$ in the crystal 1, the direction of the resultant electric field of $F_v$ and $F_h$ in the crystal 1 is perpendicular to the interface 3 or slightly inclined from this normal direction. The conduction electrons in the crystal 1 proceed in opposite direction to this resultant electric field and are injected into the interface 3. For injections of such direction, reflection due to the different in the effective mass of the electrons at the interface 3 is very small, thus almost all the electrons penetrate through the interface into the crystal region 2 to form a current $I_v$ flowing through $E_v$. Only a small portion of the electrons drifts along the interface 3 in the crystal 1 by the reflection at the interface 3, which forms a current $I_h$ flowing through $E_h$. In FIG. 2, the current $I_{ho}$ for $F_h$ below $F_{ho}$ corresponds to this very small drift current.

When the field intensity $F_h$ becomes larger and hence the angle of incidence of the electrons being injected into the interface 3 from the crystal 1 in the opposite direction to the resultant electric field of $F_h$ and $F_v$ becomes larger to approach to the critical angle for total reflection, the reflection at the interface 3 rapidly increases and correspondingly the horizontal current $I_h$ increases and the vertical current $I_v$ decreases. The value $F_{ho}$ in FIG. 2 is the electric field above which the reflection rapidly increases and $F_{hc}$ is the field above which total reflection occurs and at which the current is $I_{hc}$. When the field $F_h$ is above $F_{hc}$, the electrons in the crystal 1 are totally reflected at the interface 3 and prevented from going into the crystal region 2, hence the vertical current $I_v$ being substantially zero. The electrons totally reflected at the interface 3 back into the crystal region 1 are drifted along the interface by the action of the electric field, repeating the total reflection at the interface, to form the horizontal current $I_h$. An increase in the field $F_h$ under such total reflection state increases the drift velocity of the electrons along said interface and the current $I_h$ keeps a substantially linear relationship with the field $F_h$.

As has become apparent from the above description, with a field $F_h$ below $F_{ho}$ the electrons in the crystal region 1 mostly penetrate through the interface 3 into the crystal region 2 to form a vertical current $I_v$ through the external circuit. The horizontal current $I_{ho}$ which is derived out as $I_h$ in the above condition, after drifting along the interface 3 in the crystal 1, is very small.

On the other hand, for $F_h$ higher than $F_{hc}$ since the electrons in the crystal 1 are totally reflected at the interface 3, therefore the current penetrating into the crystal 2 and flowing through the external circuit as $I_v$ is substantially zero. And the electrons in the crystal 1 drift along the interface 3 achieving a multiple number of interface reflections and flow through the external circuit as $I_h$. Existence of two symmetric $F_h$ regions regarding the current $I_h$ is represented in the $I_h$ - $F_h$ characteristic of FIG. 2.

The electric field region between the values $F_{ho}$ and $F_{hc}$ is a transient region in which the horizontal current $I_h$ rapidly increases and the vertical current $I_v$ rapidly decreases according to the rapid increase in the reflectivity of the electrons at the interface along with the increase of $F_h$ since the resultant electric field of $F_h$ and $F_v$ is directed near the critical angle for total reflection. The above transition occurs when the resultant electric field of the orthogonal two electric fields $F_h$ and $F_v$ is directed in a predetermined direction, therefore with a variation of the set field intensity $F_v$ the field intensity $F_h$ for achieving the above orientation also varies.

Figures 5, 7A:
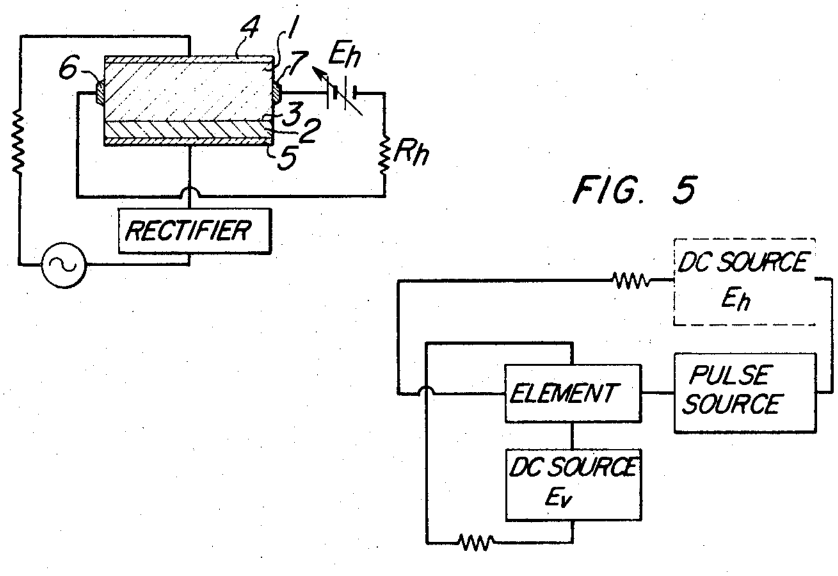
FIG. 5 is a block diagram of the electric connection of a pulse height discriminator and a switching device according to the invention.
FIGS. 7*a*, 7*b* and 7*c* are an electric connection diagram and waveforms of electric field and current of an embodiment of a current limiter according to the invention.

In the horizontal field $F_h$ region below $F_{ho}$, a variation in the field $F_h$ does not cause any substantial change in the horizontal current $I_h$, but a linear variation in the vertical current $I_v$, whereas in the $F_h$ region above $F_{hc}$, the horizontal current $I_h$ is subjected to a linear change with the variation in $F_h$ but the vertical current $I_v$ is substantially kept zero and does not change. A switching device responsive to a pulse or a pulse height discriminator can be made utilizing the above characteristics. FIG. 5 is a block diagram of a switching device or a pulse height discriminator according to the invention in which a pulse source is connected in series or in substitution to the voltage sourse of the electrical network of FIG. 1. When the electric field $F_h$ formed by the pulse and/or the voltage source is smaller than $F_{hc}$, any significant output can only be derived as a change in the vertical current $I_v$. When the field $F_h$ exceeds $F_{hc}$, a signal can be derived to another external circuit as variation only in the horizontal current $I_h$. Further, setting the electric field $F_h$ by the voltage $E_h$ at $F_{ho}$ and arranging the resultant field $F_h$ by the voltage $E_h$ and a pulse above $F_{hc}$, a switching function is achieved. Namely, the characteristic of FIG. 2 affords functions of signal separation and switching.

The electric field range in which a low reflectivity changes to the total reflection, i.e. the field difference of $F_{ho}$ and $F_{hc}$, is determined by the combination of the crystals 1 and 2, and the shape and dimension of the element. Thereby, said fields difference may be decreased small by the element structure so as to achieve $F_{ho} \approx F_{hc}$. Hence, a sharp signal separation and a rapid switching can be provided according to the above structure.

Further, since the $I_h$ - $F_h$ characteristic of FIG. 2 can be varied by the setting of the vertical field $F_v$ as is described above, in the separation of pulse signals the separation level or the switching level $F_{ho} \approx F_{hc}$ can be varied by the control of $F_v$.

Figure 6:
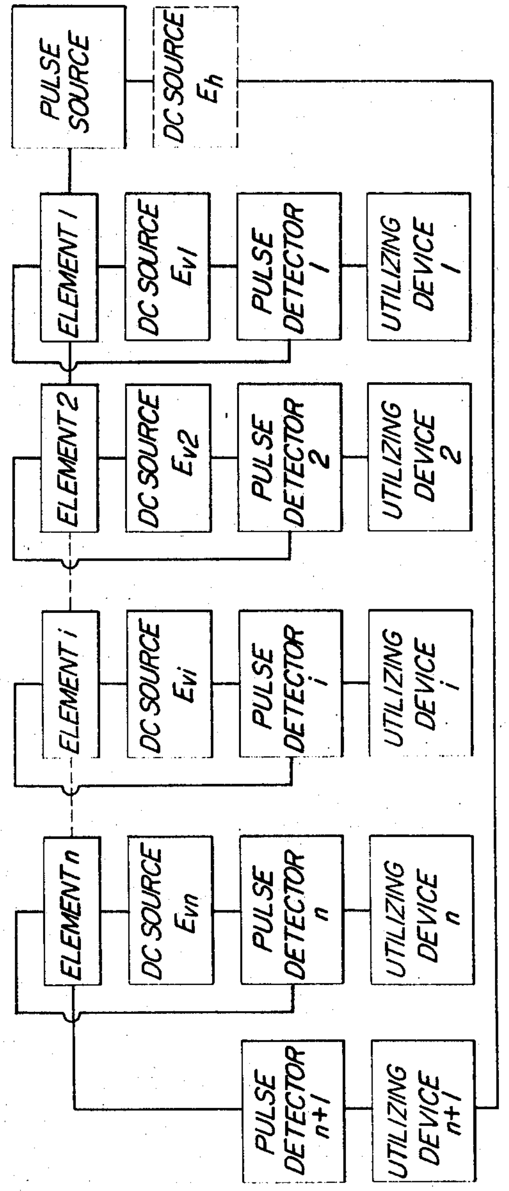
FIG. 6 is a block diagram representing the electric connection of a pulse height analyzer and a pulse signal separator according to the invention.

Although the above example is the pulse signal separation by the circuit including one element, a multi-channel pulse height analyzer of extremely simple structure can be formed by cascade connecting a multiplicity of said circuits. FIG. 6 is a block diagram of said multi-stage circuit in which n elements are applied with electric fields $F_{v1}, F_{v2}, \ldots, F_{vn}$ by respective d.c. voltage sources $E_{v1}, E_{v2}, \ldots, E_{vn}$. These electric fields are so arranged to successively increase the separation level; $(F_{ho1} \approx F_{hc1}) < (F_{ho2} \approx F_{hc2}) \approx \ldots < (F_{hon} \approx F_{hcn})$. When a pulse train having various pulse heights is supplied form a signal source to such a cascade connected circuit, pulses forming $F_{h1}$ smaller than $F_{ho1}$ are detected by the first pulse detector connected to the dc source $E_{v1}$ and then counted by a pulse counter which is the first utilizing device. Pulses forming a field $F_{h1}$ larger than $F_{ho1}$ are allowed to pass through the first element and applied to the second element. Among these pulses, those forming a field $F_{h2}$ smaller than $F_{ho2}$ in the second element are detected by the second pulse detector connected to the second d.c. voltage source $E_{v2}$ and counted by a pulse counter. In a similar manner, pulses are classified and counted by n elements and only those forming a field $F_h$ larger than $F_{hcn}$ in the *n*-th element are allowed to pass through the *n*-th element and captured by the final pulse detector and counter.

The structure of a multi-channel pulse height analyzer is described above, but this multi-stage electric connection can be used in wider field. For example, if said signal source is capable of producing superposed pulse signals including a pulse train having a constant pulse height with pulse intervals modulated according to the signal, another pulse train having a different constant pulse height with pulse intervals modulated according to the signal, etc. to separate pulses according to the pulse height, respective signals can be detected by demodulators which are the utilizing devices connected to the pulse detectors.

Embodiments utilizing the mechanism for generating the $I_h$ - $F_h$ characteristic of FIG. 2 and said characteristic are described in the foregoing description. The $I_v$ - $F_v$ characteristic shown in FIG. 3 may be similarly explained by the interface reflection of electrons.

Namely, since the characteristic of FIG. 3 is exhibited when a sufficiently high horizontal field is applied to the element, the resultant electric field at a weak vertical field $F_v$ below $F_{vo}$ directs slightly inclined from the tangent of the interface 3 and at these angles all the electrons in the crystal 1 are totally reflected at the interface. Hence, the current penetrating into the crystal 2 and flowing through the external circuit as $I_v$ is substantially zero. At a field $F_v$ slightly above $F_{vc}$ corresponding to the total reflection, the electrons penetrating from the crystal 1 through the interface 3 to the crystal 2 rapidly increase. Thus, the current becomes $I_{vc}$ at $F_{vc}$ as is shown in FIG. 3. Then, an increase in the vertical field $F_v$ increases the concentration and the drift velocity of the electrons penetrating from the crystal 1 to the crystal 2, and the current $I_v$ increases linearly with the field $F_v$.

Regarding this characteristic also, the values $F_{vo}$ and $F_{vc}$ are subjected to a change when the set value of $F_h$ is changed.

Figure 7B:
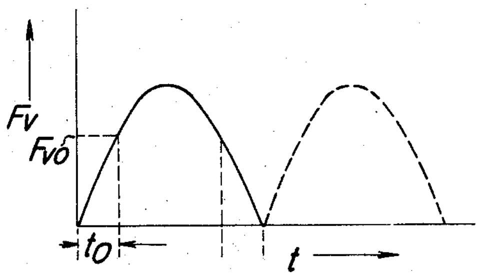
Figure 7C:
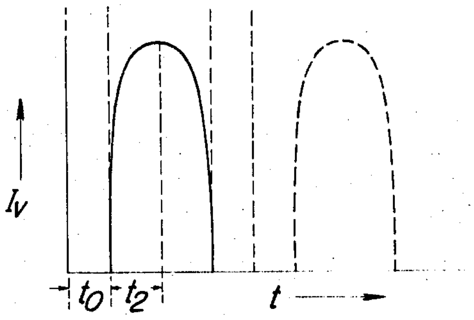

Since the vertical current $I_v$ is substantially zero in the region of the vertical field $F_v$ below $F_{vo}$ as is described above, this feature can be utilized in current limitation. FIGS. 7*a*, 7*b* and 7*c* are the electric connection, field waveform and current waveform of a current limiter device. In FIG. 7*a*, a rectified a.c. source is connected in place of a d.c. source of the foregoing embodiments. When the rectifier is a half wave rectifier, an alternating electric field $F_v$ such as shown by the solid line in FIG. 7b is formed in the element. Since a sufficiently high horizontal field $F_h$ is formed in the element, the vertical current $I_v$ is zero so long as the instantaneous value of the alternating field $F_v$ is below $F_{vo}$ (for time period $t_o$), suddenly increases when the instantaneous value $F_v$ exceeds $F_{vo}$ and sinusoidally changes when the instantaneous value $F_v$ exceeds $F_{vo}$ (for time period $t_1$) (cf. solid line in FIG. 7*b*). Namely, this device functions to limit the current flow against a sinusoidally alternating input. Here in FIGS. 7*b* and 7*c*, broken lines indicate the case when the rectifier is a fully wave rectifier and the element in FIG. 7*a* is substituted with one having a symmetric structure as shown in FIG. 4.

Further, since the value of $F_{vo}$ can be changed by the value of the applied field $F_h$ in the element, the ratio of said cut-off period $t_o$ to the turn-on period $t_1$ can easily be controlled by $F_h$, i.e. the adjustment of the variable d.c. source voltage $E_h$ connected to the electrodes 6 and 7 of said element.

As is apparent from the above description, a current limiter can be formed according to the invention, which is simple in structure and easy to adjust.

In the foregoing description, there are proposed such embodiments in which circuits for utilizing $I_v$ and $I_h$ separately are connected to an element. Now, structures combining $I_h$ and $I_v$ derived from said element and achieving a unique circuit characteristic will be described hereinafter.

Figure 8:
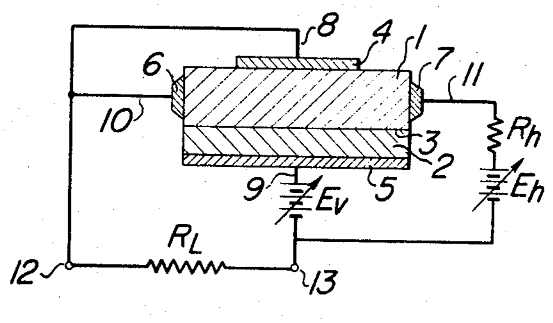
FIG. 8 is an electric connection diagram of a negative resistance device according to the invention.

FIG. 8 is an electric connection diagram of an embodiment of a negative resistance element according to the invention. In FIG. 8, electrodes 4 and 6 are connected to a common terminal 12 through leads 8 and 10. An electrode 5 is connected to the anode of a variable d.c. source $E_v$, the cathode of which is connected to a terminal 13. An electrode 7 is connected to one end of a resistance $R_h$ through a lead 11, the other end of which is connected to the anode of the variable d.c. source $E_h$. The cathode of said $E_h$ is connected to a terminal 13. Between the terminals 12 and 13, a current load $R_L$ is connected and a current $I = I_h + I_v$ flows through this load $R_L$. In FIG. 8, numerals related with the element indicate similar parts as those of FIG. 1.

In this electric connection, when the voltage of the d.c. source $E_v$ is successively increased from 0 V, fixing the voltage of the d.c. source $E_h$ at 0 V, the vertical current $I_v$ flowing across the junction surface 3 gradually increases and the current I flowing through the load $R_L$ increases. Fixing the voltage applied between electrodes 4 and 5 by $E_v$ at a certain voltage $V_{vf}$, when the voltage $E_h$ is successively increased from 0 V, the current $I_v$ flowing through interface 3 increases as is described above and hence the resultant current I still increases. This increase in the current I continues till the voltage applied by the source $E_h$ between electrodes 6 and 7 becomes $V_{hm}$ and the current I becomes $I_{max}$ in FIG. 9. When the voltage $E_h$ is still increased, the current I then decreases with the increase in the voltage and becomes the minimum current $I_{min}$ at $V_{hn}$. If the voltage of $E_h$ is further increased, the current I almost linearly increases. The appearence of this negative resistance can be explained as follows. Namely, when the voltage $V_h$ becomes $V_{hm}$, the reflection of the electrons at the interface 3 begins to rapidly increase. In this state, only a portion of the electrons in the crystal 1 can penetrate through the interface into the crystal 2 to form a vertical current $I_v$, and the rest of the electrons are prevented from penetrating through the interface 3 into the crystal 2 by the reflection at the interface and drift in the crystal 1 to form a horizontal current $I_h$. The electrons forming $I_h$, however, drift through a relatively larger region than that for the electrons forming $I_v$ due to the geometric shape of the element, therefore the decrease in the current $I_v$ by the electrons penetrating through the interface cannot be compensated by the increase in the current $I_h$. Thus, there appears a decrease in the resultant current $I = I_h + I_v$. In the region of such negative resistance, the number of reflected electrons increases with an increase in the voltage $E_h$ and the resultant current I further decreases.

Figure 9:
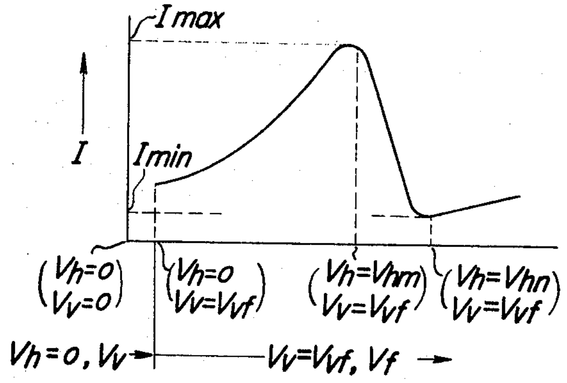
FIG. 9 is a curve of the current vs. voltage characteristic of the device of FIG. 8.

When the voltage $V_h$ between the electrodes 6 and 7 becomes $V_{hn}$, the electrons in the crystal 1 are totally reflected at the interface 3 and hence the current $I_v$ flowing across the interface is vanished to form the minimum resultant current only from $I_h$. For the voltage application above $I_{hn}$, the velocity of the electrons drifting in the crystal 1 along the interface increases corresponding to the applied voltage and hence the current $I_h$, i.e. I, increases almost linearly with the voltage. FIG. 9 shows the characteristic curve of the relation of said current I and the voltages $V_v$ and $V_h$. As is seen from the figure, there appears a negative resistance in the voltage region between $V_{hm}$ and $V_{hn}$.

As can be apparent from the figure, the appearance of the negative resistance corresponds to the transient region in which the reflection of the electrons in the crystal 1 by the interface 3 rapidly increases and then becomes total reflection. Further, it is to be stated that such reflection depends on the direction of the resultant electric field formed in the element. Therefore, when the set voltage $V_{vf}$ is changed, the voltages $V_{hm}$ and $V_{hn}$ at which a negative resistance appears and disappears, the maximum current $I_{max}$ and the minimum current $I_{min}$ are also subjected to a change. Thus, the region of the negative resistance and the negative conductance can be easily varied.

Further, if the element is so designed that the distance between the electrodes 6 and 7 becomes large, the change in the electric field component $F_h$ corresponding to the variation in the applied voltage $V_h$ naturally becomes small and hence the difference between the voltages $V_{hm}$ and $V_{hn}$ at which the rapid increase of the reflection begins and the total reflection appears becomes large. Thus, the voltage region of the negative resistance can be widened.

A negative resistance device of the above characteristics can perform such functions as amplification and oscillation by an appropriate alternation or modification of the circuit.

Figure 10:
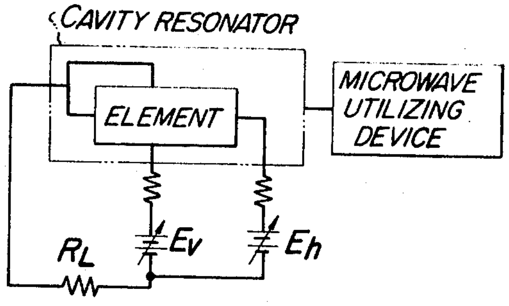
FIG. 10 is a block diagram of a microwave generator according to the invention, utilizing the negative resistance device of FIG. 8.

FIG. 10 is a block diagram of a microwave generator utilizing the above negative resistance device, in which an element having an electric network of FIG. 8 is contained in a cavity resonator with the source voltages $E_v$ and $E_h$ set in the negative resistance region. In such system and such conditions, the electrons in the element achieve an interaction with the high frequency electric field of the resonating frequency penetrated into the element and generate microwaves. The generated microwave is taken out by a utilizing device connected to the resonator, detected and modulated.

Although the above microwave generator employs a usual circuit structure in which a negative resistance element is contained in a cavity resonator, it can generate microwaves of extremely high frequency since it utilizes a negative resistance due to the electron reflection which can be controlled by the electric field.

Further, since the negative resistance characteristic changes according to the set value of $E_v$ and the negative conductance can be easily varied, said microwave generator has such advantages that the adjustment of the starting of oscillation by the variation of the negative conductance and the matching of said conductance with the load conductance of a microwave utilizing device can be easily achieved.

In the foregoing, detailed description has been made on the various embodiments of the circuit structure in which two crystal regions having the different effective mass of carriers are formed to have a junction therebetween, orthogonal electric fields are formed in the element by external voltage sources and the resultant electric field of said fields is controlled to provide unique electric characteristics. From the foregoing description, it would be apparent that the basic feature of this invention lies in the utilization of the reflection of the carriers at the interface of different effective mass and the control of said reflection by the resultant field.

Such reflection phenomenon of carriers at the interface of different effective mass is described in detail, for example, by S.S Perlman et al, "*p-n* Heterojunctions", Solid State Electronics, Vol. 71, pp. 911 – 923, 1964, Pergamon Press. Namely, it is clarified experimentally and by the calculation of classical statistics dealing with the carrier injection at an interface from all the directions that when carries are injected from a semiconductor crystal of larger effective mass $m_1$ into a semiconductor crystal of smaller effective mass $m_2$, they are reflected at the interface based on the difference in the effective mass and the transmissivity becomes $m_2/m_1$.

Further, it can be easily derived from the wave equation of electrons propagating in a solid body that the transmissivity of the electron wave function injected normal to an interface is $$\frac{2\sqrt{m_2}}{\sqrt{m_1}+\sqrt{m_2}}$$

and the reflectivity thereof is $$\frac{\sqrt{m_1}-\sqrt{m_2}}{\sqrt{m_1}+\sqrt{m_2}}.$$

Namely, similar to the reflection of electromagnetic waves at an interface of mediums of different dielectric constant, electrons are reflected as electron waves at an interface of crystals of different effective mass.

As is apparent from the foregoing, it is theoretically proper that carriers are reflected at an interface of different effective mass as a classical particle and as a particle wave. Further the reflection at an interface is also approved by experiments.

According to this invention, means are provided for controlling the incident angle of carriers at such an interface to perform total reflection so as to provide unique electrical characteristics.

In the above description, such expression is made as forming semiconductor regions of different effective mass with a junction formed therebetween. Such an element structure can be made by using a semiconductor material in which the conduction band for electrons and the filled band for positive holes, etc. form a composite band structure, and doping the material so as to form one semiconductor region of high resistivity and the other semiconductor region of low resistivity. In such a structure, when a voltage is applied to the element, a strong field is formed in the region of the larger resistivity and most of the carriers are shifted to the sub energy band by the strong field excitation. In the region of weak electric field, most of the carriers remain in the main energy band against the weak field excitation. Then due to the difference in the effective mass in these two bands, carrier reflection occurs at the interface of the semiconductor crystal regions.

Further, the present element can also be made using a semiconductor crystal of remarkable anisotropy. In this case, such a crystal body 1 is cut so as to form a junction surface perpendicular to the direction of the least effective mass. On such a surface, a semiconductor crystal 2 of high resistivity is epitaxially grown.

In the above structure, an electric voltage is applied perpendicular to the interface to form a field $F_v$ in the semiconductor crystals 1 and 2. The crystal 2 shows an extremely high resistance against the voltage applied parallel to the interface through the electrodes 6 and 7. Thus, the effect of this voltage does not enter the crystal 2. Hence in the crystal region 2, only the electric field perpendicular to the interface exists and thus the effective mass of the carriers is minimum in this direction. In the crystal region 1, a resultant field is formed and the carriers have the effective mass corresponding to the direction of this resultant field. This effective mass is naturally larger than the minimum effective mass in the region 2. Thus, the interface 3 forms an interface between regions of different effective mass and hence a reflection surface for the carriers propagating from the region 1 to the region 2.

Further, an interface of different effective mass can also be made by using a heterojunction element in which different kinds of semiconductor crystals form an interface. In a heterojunction formed of an n type semiconductor material 1 of the larger effective mass $m_1$ and another *n* type semiconductor material 2 of the smaller effective mass $m_2$, however, when the anode of the d.c. source $E_v$ is connected to the region 2, a blocking phenomenon corresponding to a reverse bias of a pn junction of an ordinary homojunction may occur in some combinations of the material. In cases of such combination, a *pn* junction is preferably employed in place of an *n-n* junction for enhancing the current control.

As is apparent from the foregoing description, according to the structure of this invention, two electric fields of different orientation are formed in a composite semiconductor crystal having a junction interface of different effective mass and one of the field intensities is controlled through a variable voltage source to control the direction of the resultant electric field and the corresponding reflection at the interface. Thus, unique electrical characteristics can be provided. In order to make a sensitive response of the interface reflection to the controlling field, it is necessary to form a substantially uniform field distribution in the element. For this reason, it is necessary to suppress the fringing field effect formed at the end portions by appropriately selecting the shapes, dimensions and resistivity of the both crystal regions and the shapes and positions of the connected electrodes.

In the foregoing structures, both of the two electric fields are formed by the application of external voltages. However, the following structure is also possible in which one electric field is preliminarily formed in the element as an internal field, the other electric field is formed by a controlling voltage source connected to the element and the resultant field is controlled by the controlling voltage source.

Figures 11, 12:
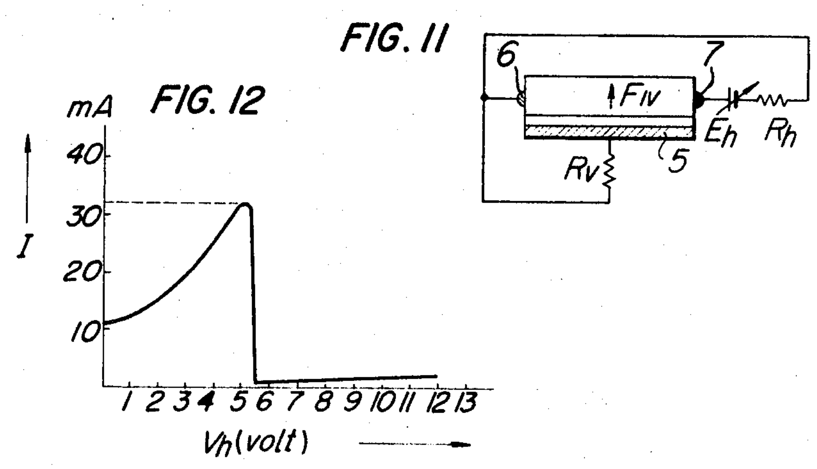
FIG. 11 is an electric connection diagram of an embodiment of the invention in which an internal electrical field is formed in the element.
FIGS. 12 and 13 are curves of the current vs. voltage characteristic of two embodiments of the negative resistance device according to the invention.

For example, the crystal 1 is formed of a mixed crystal in which the composition ratio is varied continuously along the thickness direction. In such crystal 1, an internal electric field $F_{iv}$ is formed in the direction of thickness. Another electric field $F_h$ is formed by a controlling voltage source through the electrodes 7 and 6. In such a field structure, the electrode 4 to be connected to an external voltage source for forming a vertical field $F_v$ is not necessary and thus may be eliminated. And a vertical current $I_v$ can be taken out from the electrodes 5 and 6. Thus the element is of three-terminal structure in this case. FIG. 11 shows the electrical connection of an electronic device comprising an element having an internal field. In FIG. 11, an internal field $F_{iv}$ is formed in the element and the electrical connection is done to the three terminals.

Further, in another embodiment, a controlling magnetic field is applied to the element to superpose the induced Hall electric field on one of the two electric fields and to control the interface reflection.

The structure, operation, etc. of the basic embodiments of this invention have been described in detail hereinbefore. Now, the manufacture and structure of the elements and the characteristics of the present device will be numerically shown in the form of examples.

EXAMPLE 1

The (100) surface of an n type GaSb single crystal having a resistivity of 8 Ωcm is ground and polished specular and then etched to remove mechanical strain. Using this crystal as a substrate, GaSb is grown on said surface by the vapor epitaxial method with Sn added to a thickness of 1 to 2 $\mu$ to make a grown layer having a resistivity of 0.6 Ωcm.

The back surface of said substrate crystal is ground and polished to make the thickness of the substrate about 150 $\mu$. On this polished surface and the surface of the grown layer, Ge contained Au is evaporated and heat treated to form ohmically connected electrode layers. A chip of 2 mm × 0.5 mm is cut out of said crystal. To the parallel end surfaces of the substrate crystal of this chip separated by 2 mm, Ge contained Au is evaporated and heat treated to form a pair of ohmically connected electrodes on the substrate end surfaces. Further, Au wires are connected to said electrodes and electrode layers to form the lead-out wires of the element.

Through such manufacturing steps, an element having a structure shown in FIG. 1 is formed. Here, the crystal 1 is the n type GaSb crystal having a resistivity of 8 Ωcm and the crystal 2 is the grown *n* type GaSb layer having a resistivity of 0.6 Ωcm.

The conduction band of GaSb crystal has a composite band structure. When a voltage is externally applied to the element in the direction perpendicular to the junction surface, there are formed a strong electric field in the crystal 1 of high resistivity and a weak electric field in the crystal 2 of low resistivity. When said applied voltages remain in appropriate ranges, most of the electrons in the crystal 1 are excited and shifted up to the sub energy band of larger effective mass on one hand, and most of the electrons in the crystal 2 remain in the main energy band of smaller effective mass due to insufficient field excitation and thus the interface 3 forms an interface of different effective mass for electrons.

Then this element is connected as is shown in FIG. 8 to form a semiconductor device. In this step, resistors of 1 KΩ and 2 Ω are connected as $R_h$ and $R_L$ of the figure, respectively.

In the above device, when the variable d.c. source $E_h$ is set at 0 V and the other voltage source $E_v$ is gradually increased from 0 V, the current I flowing through the resistor $R_L$ increases as is shown in FIG. 12 and becomes 10.7 mA when the voltage $V_v$ between the electrodes 4 and 5 becomes 0.15 V. Fixing the voltage $V_v$ at this value in this operation state, the voltage $V_h$ between the electrodes 6 and 7 is gradually increased from 0 V. Then, the current I continuously increases and reaches the maximum value 32 mA at $V_h = 5.2$ V. For the voltage $V_h$ above this value, the I - $V_h$ characteristic shows a negative resistance and the current I becomes the minimum value 0.4 mA at $V_h = 5.5$ V. If the voltage is further increased, the current again increases in nearly linear relation.

The above is one example of the characteristics of this device. If the set voltage $E_v$ is varied, the above characteristic also varies in correspondence to the variation. With a larger voltage $E_v$, the negative resistance becomes smaller.

A d.c. voltage $V_v = 0.15$ V is applied between the electrodes 4 and 5 of the above element and a pulse signal source generating a pulse train of wave height 4 V and another pulse train of a wave height 8 V is connected to the electrode 7 to form the circuit connection shown in FIG. 5. In this circuit arrangement, the pulse train of the wave height 4 V generates a pulse train corresponding to the current $I_v$ flowing through the circuit connecting the electrodes 4 and 5 and the other pulse train of the wave height 8 V generates a pulse train corresponding to the current $I_h$ flowing through the circuit connecting the electrodes 6 and 7. Thus, the separation of pulse signals is done.

Further, in the manufacturing steps of said element, the dimensions of the chip to be cut out is made as 1.5 mm × 6 mm and the evaporated electrode of this chip is connected to a copper block of large heat capacity to use it as a heat dissipator. Except these points, an element is formed by the similar steps as before. When a d.c. voltage 16.5 V is applied between the electrodes 6 and 7 and the electrode 5 is connected to the a.c. voltage source of 0.3 V with half wave rectification, the current $I_v$ is zero amps for voltages below 0.15 V and begins to flow at this voltage. The maximum current was 0.41A. Namely, the phase angle regions of the applied a.c. voltage at which the current $I_v$ is prevented to flow are $0° < \theta < 30°$ and $150° < \theta < 180°$ and the phase angle region in which the current $I_v$ is allowed to flow is $30° \leq \theta \leq 150°$.

Said phase angles also change when the peak value of the applied a.c. voltage is varied. For example, with an a.c. voltage having a peak value of 0.16 V, the maximum current becomes 0.33 A and the phase angle range in which the current $I_v$ is prevented from flowing is $0° < \theta < 69°40$ minutes and $110°20$ minutes $< \theta < 180°$. As is apparent from the above, current control can be made by such a device.

EXAMPLE 2

The (111) surface of an n type GaP single crystal having a carrier concentration of $7 \times 10^{15}$ cm$^{-3}$ and an electron mobility of 100 cm$^2$V sec is ground and polished and then etching treated. Using the above crystal as a substrate, an *n* type GaAs layer having a carrier concentration of $5 \times 10^{15}$ cm$^{-3}$ and a resistivity of 0.1 Ωcm is epitaxially grown on said surface to a thickness of 3 $\mu$ by the gas phase reaction of Ga-$AsCl_3$-$H_2$ system.

The back surface of the substrate of this crystal body is ground to make the thickness of the substrate about 300 $\mu$. On this ground surface and the surface of the grown GaAs layer, Au including Ge is evaporated and then heat treated to form a pair of ohmically connected electrodes on the crystal body. From this crystal body, a chip of 0.5 mm × 2 mm is cut out and the cut surfaces are ground and etched. Then, on the opposite end surfaces of the substrate separated by 2 mm, Au which includes Ge is evaporated and heat treated to form a pair of ohmically connected electrodes on the end surfaces of the substrate. To this pair of electrode and said pair of electrode layers, Au wires are connected respectively as leads. It is apparent that this element has a similar structure as that of FIG. 1, where the crystal 1 is the GaP crystal and the crystal 2 is the GaAs crystal. Thus the element is apparently a heterojunction element. In GaP and GaAs crystals, the effective mass of a conduction electron is larger in the former. Thus, the junction interface 3 between these crystals form a interface of different effective mass effective for the reflection of electrons.

When the voltage-current characteristic of the above element was measured by applying a d.c. voltage between said pair of electrodes 4 and 5, with the GaAs crystal connected to the anode of the voltage source the element showed a characteristic corresponding to the forward characteristic of an ordinary pn junction with a rising up voltage at 0.6 V and with the GaAs crystal connected to the cathode of the source, it shows a so-called reverse characteristic and a slow insulation breakdown at a breakdown voltage of about 7 V.

Resistors of 300 Ω and 2 Ω are used as $R_h$ and $R_L$ respectively in the circuit arrangement of FIG. 8 to form a negative resistance device.

Figure 13:
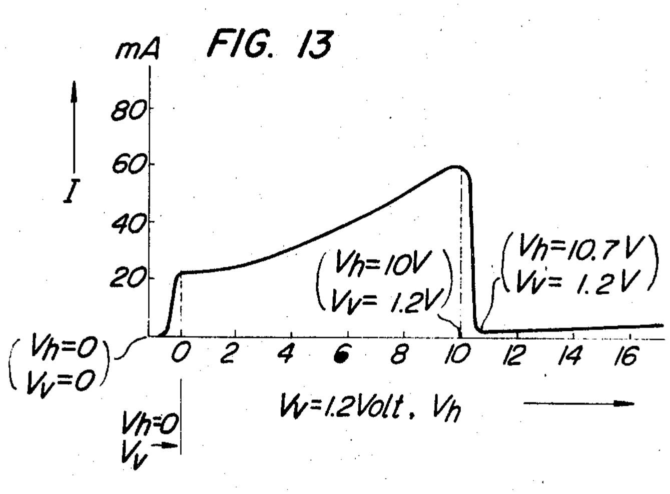

The voltage $E_h$ of the figure is first set at 0 V and voltage $E_v$ is gradually increased. Then the current I flowing through the resistor $R_L$ increases as is shown in FIG. 13 and reaches a value of 23 mA at $V_v$ = 1.2 V. Fixing the voltage $V_v$ at 1.2 V, the voltage $V_h$ of the source $E_h$ is gradually increased next. Then, the current I continues to increase and the maximum current of 60 mA is allowed to flow at $V_h$ = 10 V. For $V_h$ > 10 V, the element shows a negative resistance characteristic and the current decreases to 2.4 mA at $V_h$ = 10.8 V. When the voltage $V_h$ is further increased, the current increases in substantially linear relationship to this.

In the above arrangement, if the value of the set voltage $V_v$ is changed from 1.2 V to 0.8 V, the maximum current of 36 mA is allowed to flow at $V_h$ =6.7 V and the minimum current of 1.6 mA is allowed to flow at $V_h$ = 7.2 V. Thus, the voltage range and the value of the negative resistance are varied.

Since the appearance of such negative resistance represents the existence of a controllable interface reflection, it is evident that a pulse signal separator and a current limiter can be formed using this element.

EXAMPLE 3

Figure 14:
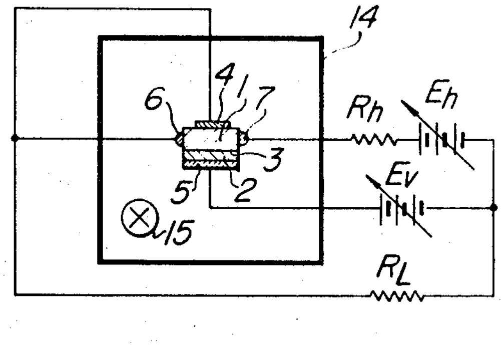
FIG. 14 is a cross-sectional diagram of a switching device utilizing a magnetic field according to the invention.

In the manufacturing steps of said example 2, the substrate is ground to a thickness of 150 $\mu$ with all other details done similarly to form an element. A switching element controllable by a magnetic field can be made using this element. FIG. 14 shows an electric connection of such a switching device, in which the element is connected in a similar circuit arrangement as that of FIG. 8 and further positioned between a pair of poles 14 of electromagnet. Here, the magnetic poles 14 are so disposed that a magnetic field 15 is parallel to the interface 3 and the electrodes 4 and 5 and perpendicular to the line connecting the electrodes 6 and 7.

In the above device, when the voltage $V_v$ between the electrodes 4 and 5 is set at 0.8 V and the voltage $V_h$ between the electrodes 6 and 7 is increased from 0 V, the maximum current of 68 mA is allowed to flow at $V_h$ = 13.3 V and a negative resistance appears at $V_h$> 13.3 V. Here, fixing the value of $V_h$ at or slightly below 13.3 V, when said electromagnets are excited to form a magnetic field 15 of about 1950 gauss between the magnet poles in the direction from the front surface to the back surface of the paper as shown in FIG. 14, said current rapidly decreases to 0.9 mA.

Namely, switching between two currents can be done by a magnetic field. This phenomenon is considered to arise since the Hall voltage generated by the applied magnetic field causes the total reflection of an electron flow at the interface.

The negative resistance characteristic can be widely varied by co-using the magnetic field application with the I - $V_h$ characteristic of the negative resistance device. Namely referring to FIG. 14, fixing the applied magnetic field 15 at a certain intensity a negative resistance appears at a different value of $V_h$ to the case of no magnetic field when the source $E_h$ is varied.

As is also apparent from the foregoing three examples, this invention provides a semiconductor device comprising a junction semiconductor element having an interface of different effective mass, a circuit arrangement for deriving a current due to the carriers crossing through the interface of the element and another current due to the carriers drifting only in one semiconductor region, means for establishing two kinds of electric field having different orientation in the element, and a electromagnetic control source for controlling one of the two electric field intensity, thereby the direction of the resultant electric field, i.e. the incident angle of the carriers at the interface being controlled, and the carriers performing penetration and total reflection according to the incident angle so as to provide a unique electric characteristic.

Therefore, although *n* type III – V semiconductor crystals are exemplified as the element material in the embodiments, it is also possible to use P type crystals and employ an element structure forming an interface of different effective mass as for positive holes or to use other semiconductor crystals than those of III – V group.

As for the formation of electric fields having different direction in the element, it has been already stated that such electric fields can be formed not only by two kinds of electric sources but also when one of them is an internal electric field inherent to the crystal or is formed by an applied magnetic field.

Further, it has been already stated that one of the electric field intensities can be controlled not only by a controlling electric source connected to the element but also by a magnetic field applied to the element.

As the embodiments or applications of this invention, such devices having the functions of switching, pulse separation, current limitation and negative resistance are described. This invention can be more widely applicable by modification, alternation and addition of utilizing devices. For example, it is well known that devices having a function of oscillation, amplification, switching, etc. can be formed by doing appropriate modification or addition to a negative resistance device. A part of them is described before.

Since the present device is based on the control of the reflection of the majority carriers at an interface of different effective mass by the applied electromagnetic field, the response of the carriers to the controlling signal is extremely faster than that of the conventional pn junction semiconductor element and can sufficiently follow the signals of high frequency to provide superior high frequency characteristics.

Further, since the electric field in the element is for controlling the drift direction of carriers, such high field as is the case with a bulk semiconductor element is not necessary. Thus, the present device consumes very less electric power compared with that of a bulk element and perform an active operation at a higher efficiency.

Yet further, since the electric characteristics of the present device can be easily varied by the setting conditions, not only the adjustment or the control of the operation is easy but also a wide variety of operations can be achieved by connecting with a utilizing circuit. Thus, the present invention can provide a very flexible device.

We claim:

1. A solid state electronic device capable of controlling the carrier reflection at the interface of a pair of semiconductor crystal regions having the different effective mass of carriers comprising:

an element body having at least a pair of regions joined with each other, each of said regions being made of a semiconductor crystal, said crystal being selected and arranged in such a manner that carriers passing across the interface of said joined regions have the different effective mass from each other in said two regions;

a first circuit means for forming a current path for the carriers passing said interface;

a second circuit means for forming a current path for the carriers which are reflected at said interface and drift only in one region having the larger effective mass of carriers;

means for forming a plurality of electric fields in said element, at least one of said fields having a different direction from the rest, and the field strength of at least one of said fields being variable so that a resultant field of said fields may have the direction effecting the total reflection of carriers due to the difference of said effective masses at said interface, thereby causing an abrupt change of electric current in said current paths.

2. A solid state electronic device according to claim 1, wherein said element has only a pair of regions.

3. A solid state electronic device according to claim 1, wherein said element body has three laminated regions so that two parallel interface are formed, the two outer regions of said three laminated regions being made of a same semiconductor material and arranged in a symmetric manner, the semiconductor for the middle region being so selected and arranged as to have a larger effective mass of carriers than said outer regions.

4. A solid state electronic device according to claim 1, wherein said first circuit means is connected with a pair of contact means provided on the opposite end surfaces of said element which are parallel to said interface, and said second circuit means is connected with a second pair of contact means provided on the opposite end surfaces of one region having larger effective mass of carriers which are perpendicular to said interface.

5. A solid state electronic device according to claim 4, wherein one of said field forming means is a first voltage source connected in said first circuit means, and the other of said field forming means is a second voltage source connected in said second circuit means.

6. A solid state electronic device according to claim 5, wherein said second voltage source includes a pulse source generating pulses of various pulse height and said first voltage source is a variable DC source, whereby the pulses with a pulse height above a value corresponding to a given voltage of said DC source form the resultant field which causes said total reflection and produce a response in said second circuit means, and the pulses with a pulse height below said value produce a response in said first circuit means.

7. A solid state electronic device according to claim 6, wherein said device includes a plurality of said elements, said elements being cascade-connected in such a manner that said second circuit means for said elements are in series connection with each other, and said pulse height causing said total reflection is made different in each of said element, whereby the pulse height discrimination may be effected by said series of elements.

8. A solid state electronic device according to claim 5, wherein said first voltage source includes a rectified AC voltage generator, and said second voltage source is a variable DC source, whereby said AC voltage may produce a current in said first circuit means at the voltage values in the range above a value corresponding to a given voltage of said DC source to cause the limitation of the AC current.

9. A solid state electronic device according to claim 5, wherein each of said first and second voltage sources is a variable DC source, and said first and second circuit means are connected with a common resistive means, whereby at a given voltage of said first voltage source, the current flowing through said resistive means exhibits a negative resistance characteristics against the voltages of said second voltage source due to said total reflection of carriers.

10. A solid state electronic device according to claim 9, wherein said device further comprises a cavity resonator having said element therein and a microwave utilizing device coupled to said resonator, whereby the microwaves generated due to said negative resistance of said element are transmitted to and used in said utilizing device.

11. A solid state electronic device according to claim 9, wherein said device further comprises means for applying a magnetic field to said element in the direction parallel to said interface and perpendicular to the line connecting said second contact means, and at a give voltage value of said first voltage source, the voltage of said second voltage source is set at the value slight below the onset of said negative resistance characteristics, whereby a Hall voltage induced by said magnetic field causes said total reflection of carriers to effect the abrupt reduction of said current flowing through said common resistive means.

12. A solid state electronic device according to claim 1, wherein said region of larger effective mass of carriers is made of a mixed crystal, the composition of said mixed crystal being gradually varied in the direction perpendicular to said interface, whereby an inner electric field is formed in said mixed crystal and said inner field is used as one of said electric field.

13. A solid state electronic device according to claim 1, wherein said device includes means for applying a magnetic field to said element to form a Hall field in said element, and said magnetic means is one of said electric field forming means.

14. A solid state electronic device according to claim 4, wherein said region of larger effective mass of carriers is made of n type GaSb of higher resistivity and said region of smaller effective mass of carriers is made of *n* type GaSb of lower resistivity, whereby for the proper voltage range applied in the vertical direction to said interface, the carriers in said region of higher resistivity are raised into a large effective mass band and the carriers in said region of lower resistivity remain in a small effective mass band.

15. A solid state electronic device according to claim 4, wherein said region of larger effective mass of carriers is made of *n* type GaP, and said region of smaller effective mass of carriers is made of *n* type GaAs.

* * * * *